(12) United States Patent
Sakurai et al.

(10) Patent No.: US 10,229,727 B1
(45) Date of Patent: Mar. 12, 2019

(54) APPARATUS AND METHOD FOR CONTROLLING ERASING DATA IN FERROELECTRIC MEMORY CELLS

(71) Applicant: Micron Technology, Inc., Boise, ID (US)

(72) Inventors: Kiyotake Sakurai, Hino (JP); Yasushi Matsubara, Isehara (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/919,994

(22) Filed: Mar. 13, 2018

(51) Int. Cl.
  *G11C 11/22* (2006.01)
(52) U.S. Cl.
  CPC ........ *G11C 11/2275* (2013.01); *G11C 11/221* (2013.01); *G11C 11/2257* (2013.01); *G11C 11/2259* (2013.01)
(58) Field of Classification Search
  CPC ... G11C 11/22; G11C 11/2275; G11C 11/221; G11C 11/2257; G11C 11/2259
  USPC ................ 365/49.13, 65, 109, 117, 145, 148
  See application file for complete search history.

(56) References Cited

U.S. PATENT DOCUMENTS

| 5,309,392 A * | 5/1994 | Ootsuka | G11C 7/005 257/295 |
| 5,383,150 A * | 1/1995 | Nakamura | G11C 11/22 365/145 |
| 5,524,093 A * | 6/1996 | Kuroda | G11C 11/22 257/E27.104 |
| 2002/0034091 A1 * | 3/2002 | Miyakawa | G11C 11/22 365/145 |
| 2007/0041234 A1 * | 2/2007 | Nishihara | G11C 11/22 365/145 |

OTHER PUBLICATIONS

Unpublished U.S. Appl. No. 15/674,382, entitled "Cell Bottom Node Reset in a Memeory Array", filed Aug. 10, 2017.

* cited by examiner

*Primary Examiner* — Harry W Byrne
(74) *Attorney, Agent, or Firm* — Dorsey & Whitney LLP

(57) ABSTRACT

Methods and apparatuses for erasing data on a plurality of ferroelectric memory cells in a memory cell array in a memory apparatus are disclosed. An example apparatus includes: a memory cell array including a first plurality of word lines; a digit line; and a plurality of ferroelectric memory cells; a control circuit that provides a section select signal and a word line select signal to select a second plurality of word lines among the first plurality of word lines responsive to an address; and an address decoder that activates the second plurality of word lines. Each ferroelectric memory cell includes: a ferroelectric capacitor having a first terminal coupled to a cell plate node and a second terminal coupled to a selection circuit that couples the digit line to the second terminal responsive to a signal on a corresponding word line of the second plurality of word lines.

31 Claims, 12 Drawing Sheets

APPARATUS AND METHOD FOR CONTROLLING ERASING DATA IN FERROELECTRIC MEMORY CELLS

BACKGROUND

Memory devices are widely used to store information in various electronic devices such as computers, wireless communication devices, cameras, digital displays, and the like. Information is stored by programming different states of a memory device. For example, binary devices have two states, often denoted by a logic "1" or a logic "0." In other systems, more than two states may be stored. To access the stored information, the electronic device may read, or sense, the stored state in the memory device. To store information, the electronic device may write, or program, the state in the memory device.

Various types of memory devices exist, including random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, and others. Memory devices may be volatile or non-volatile. Non-volatile memory, e.g., flash memory, can store data for extended periods of time even in the absence of an external power source. Volatile memory devices, e.g., DRAM, may lose their stored state over time unless they are periodically refreshed by an external power source. A binary memory device may, for example, include a charged or discharged capacitor. A charged capacitor may, however, become discharged over time through leakage currents, resulting in the loss of the stored information. Certain features of volatile memory may offer performance advantages, such as faster read or write speeds, while features of non-volatile memory, such as the ability to store data without periodic refreshing, may be advantageous.

FeRAM may use similar device architectures as volatile memory but may have non-volatile properties due to the use of a ferroelectric capacitor as a storage device. For example, FeRAM has advantages of faster writing performance, endurance for repeated memory access with lower power consumption than other non-volatile RAMs. FeRAM can provide non-volatile functionality comparable to that of flash memory in a speed and architecture comparable to that of dynamic random access memory (DRAM). Thus, FeRAM devices may thus have improved performance compared to other non-volatile and volatile memory devices. It is desirable, however, to improve the operation of FeRAM devices. For example, it may be desirable to have improved imprinting prevention and memory data security using consecutive data erasing (wipe-out) operations which have been conventionally executed by a memory controller outside of a FeRAM device.

DETAILED DESCRIPTION

Various embodiments of the present disclosure will be explained below in detail with reference to the accompanying drawings. The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized, and structure, logical and electrical changes may be made without departing from the scope of the present invention. The various embodiments disclosed herein are not necessary mutually exclusive, as some disclosed embodiments can be combined with one or more other disclosed embodiments to form new embodiments.

Figure 1:
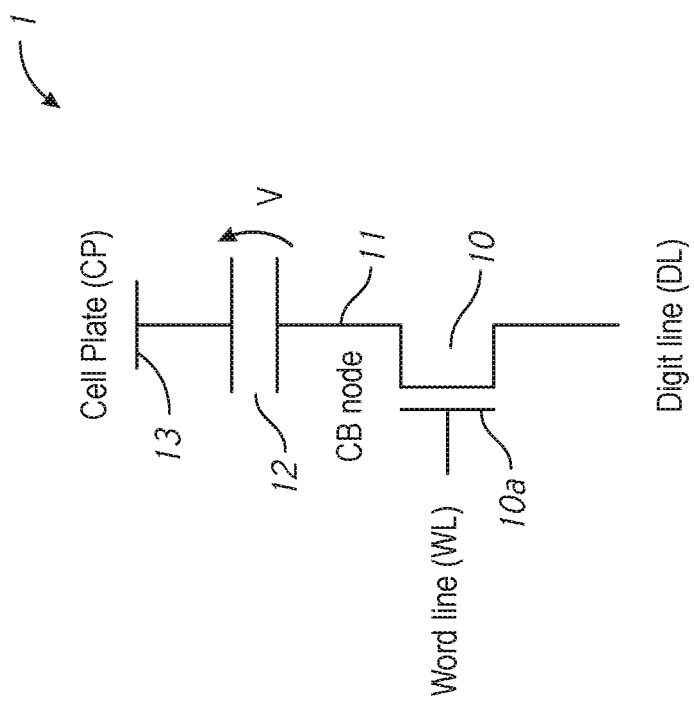
FIG. 1 is a circuit diagram of a ferroelectric memory cell in accordance with various embodiments of the present disclosure.

FIG. 1 is a circuit diagram of a ferroelectric memory cell 1 in accordance with various embodiments of the present disclosure. For example, the ferroelectric memory cell 1 may include a selection circuit 10 and a capacitor 12. For example, a selection circuit 10 may be an n-type field effect transistor and a capacitor 12 may be a ferroelectric capacitor. When a word line (WL) is activated, a transistor gate 10a of the selection circuit 10 receiving a signal on the word line (WL) may be activated. Thus, responsive to the activated word line (WL), the selection circuit 10 may couple a digit line (DL) to a cell bottom (CB) node 11 of the capacitor 12. The other node of the capacitor 12 is a cell plate (CP) 13 coupled to a cell plate (CP) line (that will be described later). While the digit line (DL) is coupled to the capacitor 12, the capacitor 12 may be polarized in either a logic "0" state or a logic "1" state representing a logic value of the ferroelectric memory cell 1, responsive to a voltage of the CB node and a voltage of the cell plate (CP) to access (e.g., read and/or write) the ferroelectric memory cell 1. By executing an erasing (wipe-out) operation erasing data in the capacitor 12, the ferroelectric memory cell 1 may be set in a non-polarized state (neither "0" nor "1" state).

Figure 2:
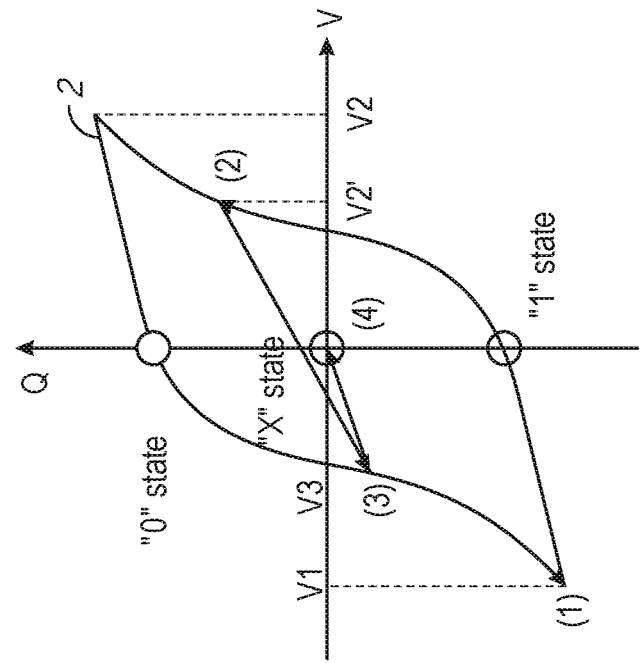
FIG. 2 is a diagram of example non-linear electrical property for the memory ferroelectric memory cell 1 in an erasing (wipe-out) operation in accordance with various embodiments of the present disclosure.

Ferroelectric materials of the capacitor 12 have non-linear polarization properties. FIG. 2 is a diagram of an example non-linear electrical property for the ferroelectric memory cell 1 in an erasing (wipe-out) operation in accordance with various embodiments of the present disclosure. For example, the diagram of FIG. 2 is a graph including a hysteresis curve 2 that depicts an electrical charge (Q) stored on a ferroelectric capacitor (e.g., the capacitor 12 in the ferroelectric memory cell 1 of FIG. 1) as a function of a voltage difference V between the CP node and the CB node of the ferroelectric capacitor 12 during an erasing (wipe-out) operation of the ferroelectric memory cell 1. The electrical charge (Q) is proportional to the polarization of the capacitor 12.

A ferroelectric material is characterized by a spontaneous electric polarization, for example, it maintains a non-zero electric polarization in the absence of an electric field. Example ferroelectric materials include barium titanate (BaTiO3), lead titanate (PbTiO3), lead zirconium titanate (PZT), and strontium bismuth tantalate (SBT). The ferroelectric capacitors described herein may include these or other ferroelectric materials. Electric polarization within a ferroelectric capacitor results in a net charge at the ferroelectric material's surface and attracts opposite charge through the capacitor terminals. Thus, charge is stored at the interface of the ferroelectric material and the capacitor terminals. Because the electric polarization may be maintained in the absence of an externally applied electric field for relatively long times, even indefinitely, charge leakage may be significantly decreased as compared with, for example, capacitors employed in volatile memory arrays. This may reduce the need to perform refresh operations as described above for some volatile memory architectures.

The hysteresis curve 2 may be understood from the perspective of a single terminal (e.g., the CB node or the CP node) of a capacitor. By way of example, if the ferroelectric material has a negative polarization, positive charge accumulates at the terminal. Likewise, if the ferroelectric material has a positive polarization, negative charge accumulates at the terminal. Additionally, it should be understood that the voltages in hysteresis curve 2 represent a voltage difference across the capacitor and are directional. For example, a positive voltage may be realized by applying a positive voltage to the terminal in question and maintaining the second terminal at ground (or approximately zero volts (0V)). A negative voltage may be applied by maintaining the terminal in question at ground and applying a positive voltage to the second terminal, for example, positive voltages may be applied to negatively polarize the terminal in question. Similarly, two positive voltages, two negative voltages, or any combination of positive and negative voltages may be applied to the appropriate capacitor terminals to generate the voltage difference shown in the hysteresis curve 2.

As depicted in the hysteresis curve 2, the ferroelectric material may maintain a positive or negative polarization with a zero voltage difference, resulting in two possible charged states: a charge state that corresponds to two charge states (e.g., "0" state and "1" state) representing a logic "0" and a logic "1". According to the example of FIG. 2, charge states represent a logic 0 and a logic 1. In some examples, the logic values of the respective charge states may be reversed without loss of understanding. A logic 0 or 1 may be erased from the ferroelectric memory cell 1 by controlling the electric polarization of the ferroelectric material in the capacitor 12, and thus the charge on the capacitor terminals, by applying voltages.

In the beginning of the erasing operation, the ferroelectric memory cell 1 may store either the logic "0" state or the logic "1" state, depending on the capacitor 12 storing a positive electrical charge (Q) corresponding to the logic "0" state or a negative electrical charge (Q) corresponding the logic state "1". For example, applying a net negative voltage V1 across the capacitor 12 may result in charge decrease until charge state shown by (1) is reached. Upon removing the net negative voltage V1, a positive voltage V2', lower than a net positive voltage V2 may be applied to the capacitor 12 and the charge state (1) follows a path from (1) to (2) until it reaches charge state (2) at the voltage V2'. Upon reaching the voltage V2', a negative voltage V3 may be applied to the capacitor 12 and the charge state (2) follows a path from (2) to (3) until it reaches charge state (3). After removing the negative voltage V3, charge state (3) follows path from (3) to (4) until it reaches charge state (4) that is "X" state (i.e., non-polarized state) at zero voltage.

Figure 3A:
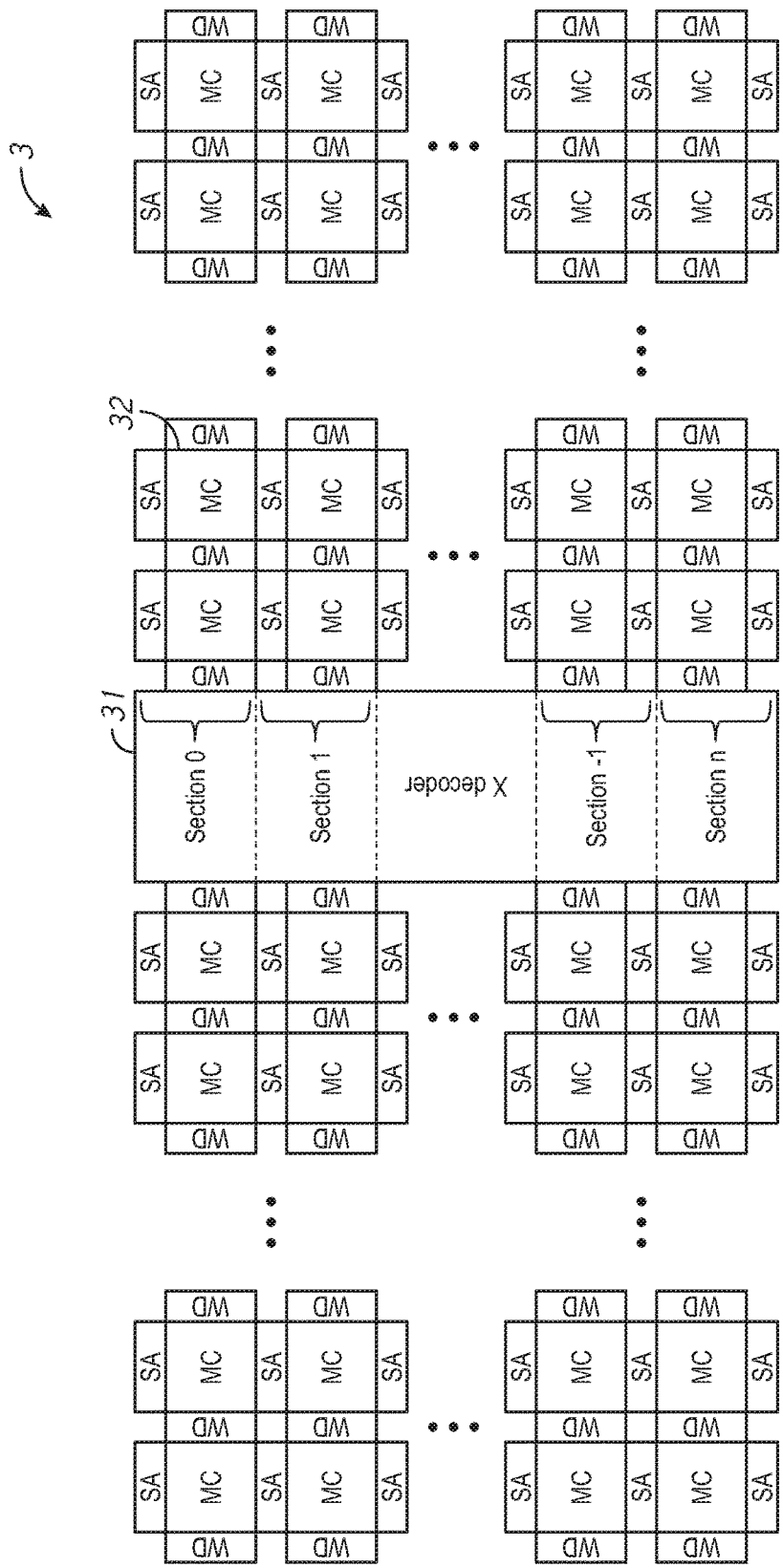
FIG. 3A is a layout diagram of a memory apparatus including a plurality of memory cell arrays, word a plurality of word drivers, and a plurality of sense amplifiers and a decoder in accordance with various embodiments of the present disclosure.

FIG. 3A is a layout diagram of a memory apparatus 3 including a plurality of memory cell arrays (MCs), word a plurality of word drivers (WDs), and a plurality of sense amplifiers (SAs) and an X decoder 31 in a memory apparatus in accordance with various embodiments of the present disclosure. Across the X decoder 31, memory cell arrays (MCs) 32 may be disposed on the right and left, respectively. The plurality of memory cell arrays (MCs) 32 may be divided to Section 0 to Section n (where n is a natural number) and the plurality of memory cell arrays (MCs) 32 in each section are coupled to a corresponding plurality of word drivers (WD) that may receive word driver select signals from the X decoder 31. The plurality of sense amplifiers (SAs) may be located between two adjacent sections of memory cell arrays (MCs) 32, perpendicular to the word drivers (WDs) respective to each memory cell array (MC) 32.

Figure 3B:
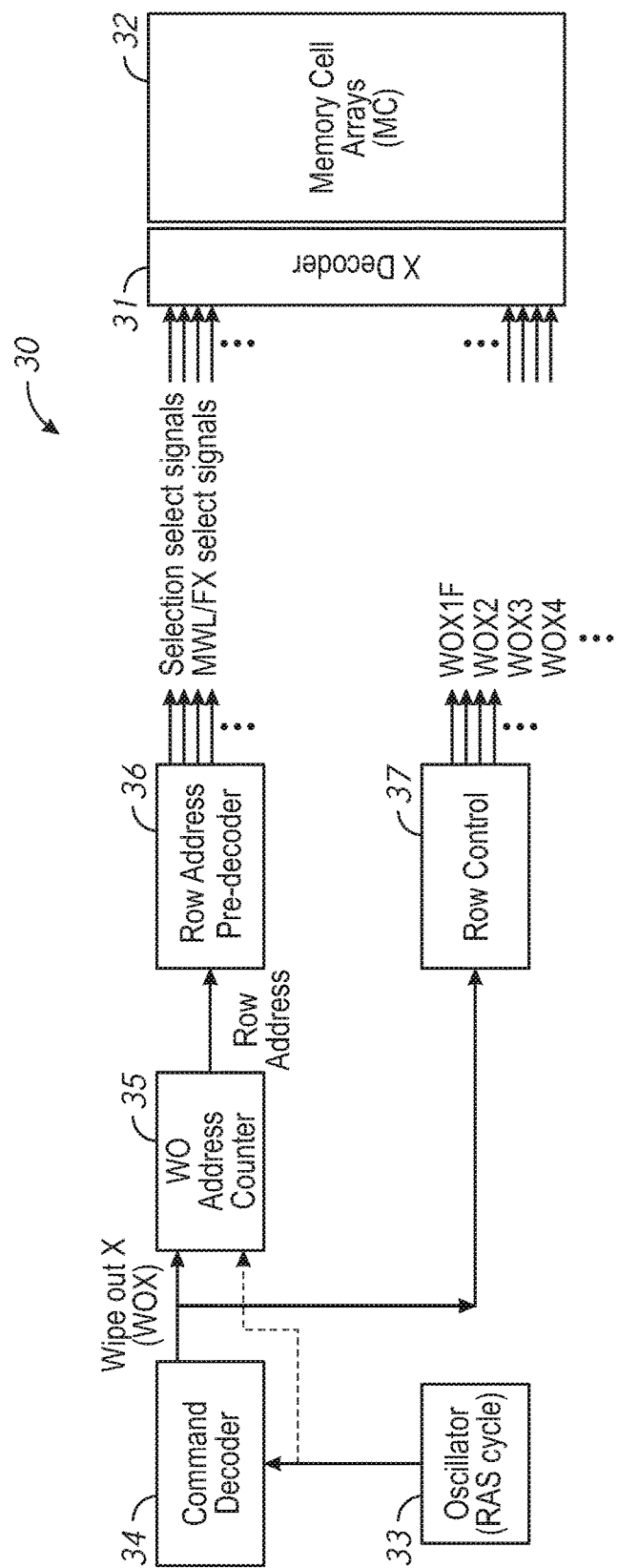
FIG. 3B is a block diagram of a control circuit in the memory apparatus in accordance with various embodiments of the present disclosure.

FIG. 3B is a block diagram of a control circuit 30 in the memory apparatus 3 in accordance with various embodiments of the present disclosure. For example, the control circuit 30 may include an oscillator 33, a command decoder 34, a wipe-out (WO) address counter 35, a row address pre-decoder 36 and a row control circuit 37. The row address pre-decoder 36 and the row control circuit 37 may be coupled to the X decoder 31 that is coupled to the plurality of memory cell arrays 32. The oscillator 33 may internally generate a row address strobe (RAS) cycle (tRC) of a wipe-out operation and provide the RAS cycle (tRC) to the command decoder 34. The control circuit 30 allows accessing word lines one by one each RAS cycle of the wipe-out operation. A combination of internal voltages may be provided in a sequence to digit lines within the RAS cycle to execute the wipe-out operation to set a target memory cell in the non-polarized state. The command decoder 34 may provide a Wipe Out X signal (WOX) that may be a start address of the wipe-out operation to the WO address counter 35 and the row control circuit 37. The WO address counter 35 may increase or decrease a row address (X address) for the wipe-out operation internally responsive to every RAS cycle (e.g., the RAS cycle from the oscillator 33 or from a bank address control circuit (not shown)) during the wipe-out operation, like an internal counter for a self-refresh of DRAM, and may provide the row address to the row address pre-decoder 36. The row address pre-decoder 36 may receive the row address from the WO address counter 35, may decode the row address and further provide section select signals, main word line (MWL) select signals and word driver (FX) select signals to the X decoder 31. The row control circuit 37 may generate a plurality of wipe-out control signals (e.g., WOX1F, WOX2, WOX3, and WOX4) responsive to the Wipe Out X signal (WOX). Using the plurality of wipe-out control signals, the wipe-out operation applying a sequence of voltages to terminals of each ferroelectric memory cell, such as CB and CP nodes, and each ferroelectric memory cell either in the logic "0" state or the logic "1" state may be set to the "X" (non-polarized) state.

Figure 4:
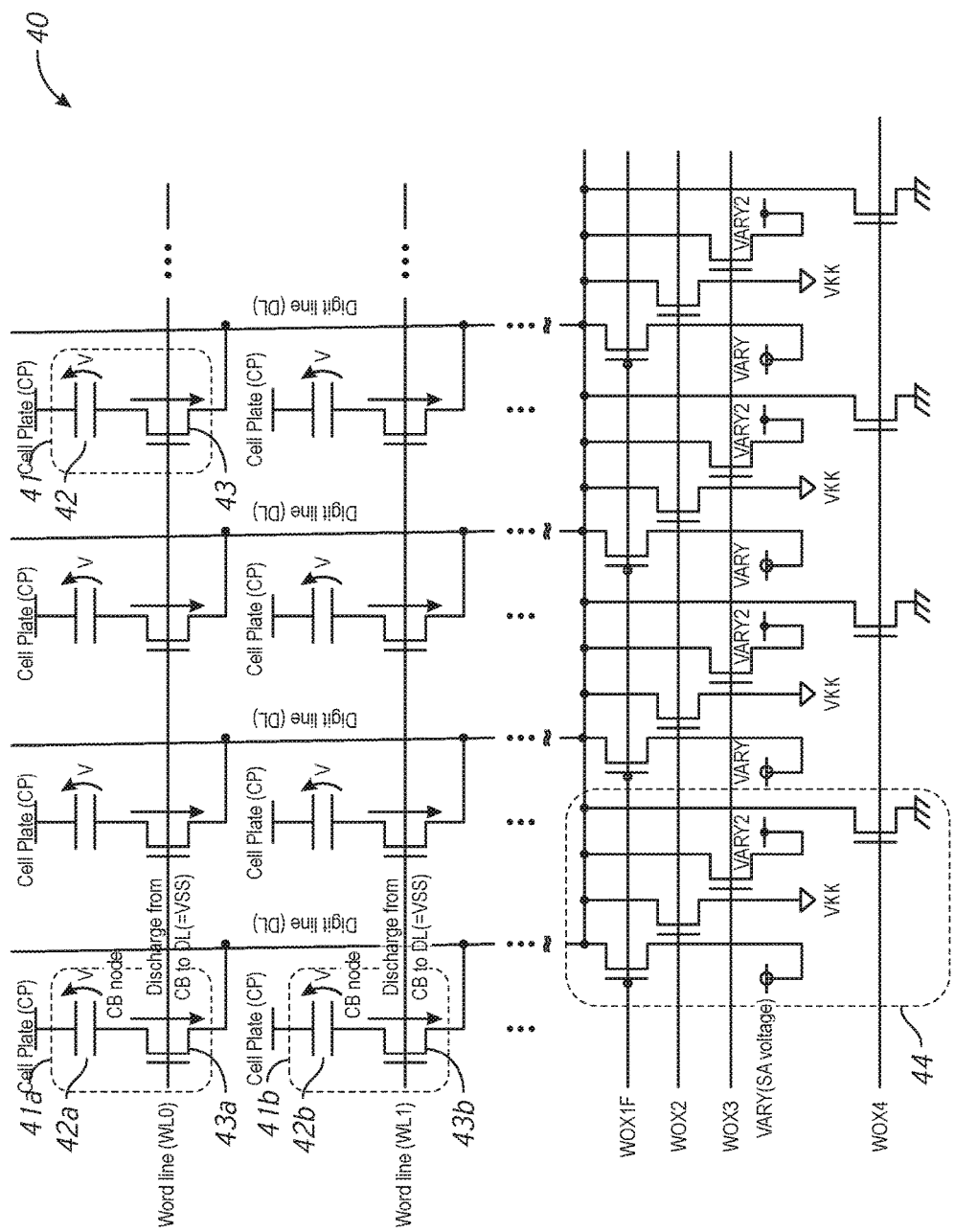
FIG. 4 is a schematic diagram of a plurality of ferroelectric memory cells and a plurality of driver circuits in a memory cell array in accordance with an embodiment of the present disclosure.

FIG. 4 is a schematic diagram of a plurality of ferroelectric memory cells 41 and a plurality of driver circuits 44 in a memory cell array 40 in accordance with an embodiment of the present disclosure. For example the memory cell array 40 may be the memory cell array 32 in FIGS. 3A and 3B. The plurality of ferroelectric memory cells 41 includes ferroelectric memory cells 41a, 41b that may be a ferroelectric memory cell 1 in FIG. 1. Each ferroelectric memory cell 41 may include a ferroelectric capacitor 42 and a selection circuit 43 (e.g., an n-type field effect transistor). Each driver circuit 44 of the plurality of the driver circuits may be configured to provide a plurality of wipe-out control signals WOX1F, WOX2, WOX3, and WOX4 to control a voltage of a digit line (DL) that is coupled to a plurality of ferroelectric memory cells 41. The voltage of the digit line (DL) that is controlled by the plurality of wipe-out control signals WOX1F, WOX2, WOX3, and WOX4 may be provided to the CB node of the ferroelectric capacitor 42 by the selection circuit 43 activated by word lines WL0, WL1, . . . etc. For example, the ferroelectric memory cell 41a may include a selection circuit 43a that is coupled to a word line WL0 and may couple the digit line (DL) to a CB node of a ferroelectric capacitor 42a responsive to an active signal on the word line WL0. Thus, the selection circuit 43a may provide the voltage on the digit line (DL). When the voltage of the digit line (DL) is substantially zero voltage (e.g., a ground voltage (Vss)), an electrical charge of the ferroelectric capacitor 42a may be discharged from the CB node to the digit line (DL) and thus a voltage difference V between the CP and CB nodes of the ferroelectric capacitor 42a may be increased. Similarly, the ferroelectric memory cell 41b includes a selection circuit 43b that is coupled to a word line WL1 and may couple the digit line (DL) to a CB node of a ferroelectric capacitor 42b responsive to an active signal on the word line WL1. Thus, when the voltage of the digit line (DL) is substantially zero voltage, an electrical charge of the ferroelectric capacitor 42b may be discharged from the CB node to the digit line (DL) and thus a voltage difference V between the CP and CB nodes of the ferroelectric capacitor 42b may be increased, when the word line WL1 is indicative of the active signal.

Figure 5A:
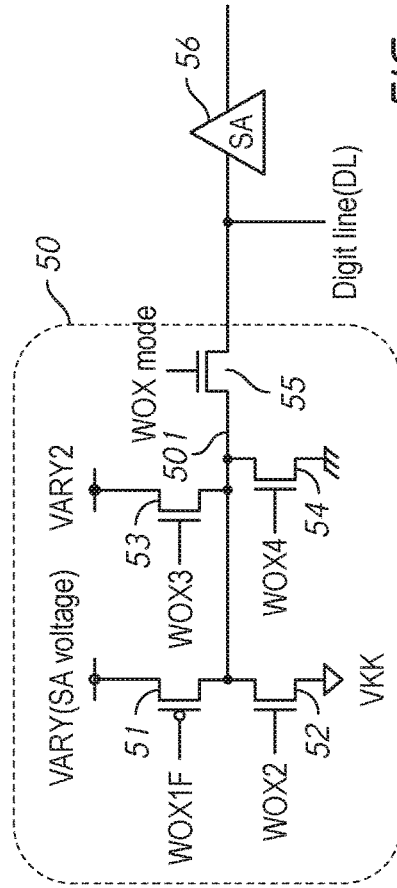
FIG. 5A is a schematic diagram of a driver circuit coupled to a sense amplifier in accordance with an embodiment of the present disclosure.

FIG. 5A is a schematic diagram of a driver circuit 50 coupled to a sense amplifier 56 in accordance with an embodiment of the present disclosure. The driver circuit 50 may be used as each of the plurality of driver circuits 44 in the memory cell array 40 of FIG. 4. The driver circuit 50 may include a first transistor 51, a second transistor 52, a third transistor 53, and a fourth transistor 54 that have drain nodes that may be coupled to a first node 501 of a mode transistor 55. The mode transistor 55 has a second node that may be coupled to a digit line (DL) and a sense amplifier (SA) 56.

Figure 5B:
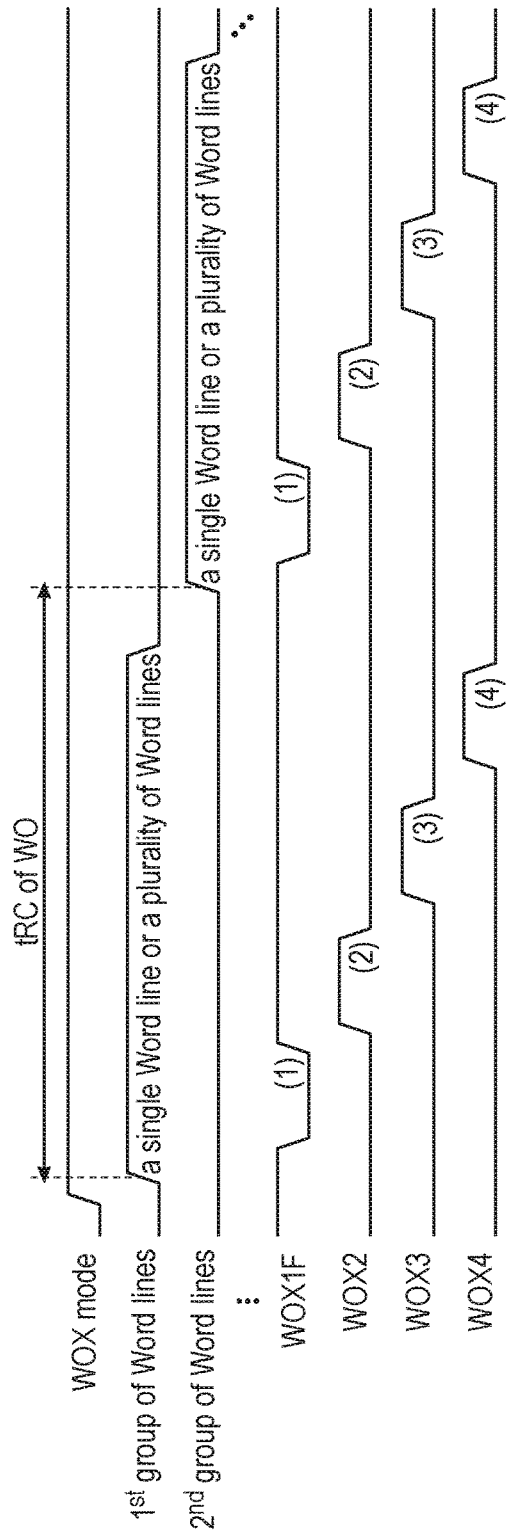
FIG. 5B is a timing diagram of the driver circuit in accordance with an embodiment of the present disclosure.

FIG. 5B is a timing diagram of the driver circuit 50 in accordance with an embodiment of the present disclosure. During the wipe-out operation, a wipe-out mode signal WOX mode may be in an active state (e.g., a logic high level). The mode transistor 55 may be an n-type field effect transistor that has a transistor gate that may receive the wipe-out mode signal WOX mode that is an active high signal. When the wipe-out mode signal WOX mode is at a logic high level and active, the mode transistor 55 may be activated and couple the first node 501 of the mode transistor 55 to the digit line (DL) and to the sense amplifier (SA) 56. Thus, responsive to the activated mode transistor 55, a voltage on the first node 501 of the mode transistor 55 may be provided to the digit line (DL) that is further coupled to the sense amplifier (SA) 56. When the wipe-out mode signal WOX mode is at a logic low level and inactive, the mode transistor 55 is inactive and the voltage on the first node 501 may not be provided to the digit line (DL).

Each word line or each plurality of word lines may be activated for the RAS cycle (tRC) of the wipe-out operation, from a first group of word line(s), a second group of word line(s), . . . etc. The wipe-out control signals WOX1F, WOX2, WOX3, WOX4 may be activated in this order for each RAS cycle to operate the wipe-out operation following paths →(1)→(2)→(3)→(4) as illustrated in the hysteresis curve 2 in FIG. 2. For example, the first transistor 51 may be a p-type field effect transistor that has a transistor gate that may receive a first wipe-out control signal WOX1F that is an active low signal. When the first wipe-out control signal WOX1F is at the logic high level and inactive, the first transistor 51 is inactive and the first node 501 of the mode transistor 55 is decoupled from an array voltage (VARY) being a positive voltage, an SA voltage for the sense amplifier (SA) 56. When the first wipe-out control signal WOX1F is at the logic low level and active, the first transistor 51 is activated and the array voltage (VARY), the SA voltage for the sense amplifier (SA) 56, may be provided to the first node 501 of the mode transistor 55 until the state (1) of the hysteresis curve 2.

The second transistor 52 may be an n-type field effect transistor that has a transistor gate that may receive a second wipe-out control signal WOX2 that is an active high signal. When the second wipe-out control signal WOX2 is at the logic low level and inactive, the second transistor 52 is inactive and a negative voltage VKK, having a magnitude larger than a half of the array voltage ½VARY and smaller than the array voltage VARY, may not be provided to the first node 501 of the mode transistor 55. When the second wipe-out control signal WOX2 is at the logic high level and active at the state (1) of the hysteresis curve 2, the second transistor 52 may be activated and the negative voltage VKK may be provided to the first node 501 of the mode transistor 55 until the state (2) of the hysteresis curve 2. The third transistor 53 may be an n-type field effect transistor that has a transistor gate that may receive a third wipe-out control signal WOX3 that is an active high signal. When the third wipe-out control signal WOX3 is at the logic low level and inactive, the third transistor 53 is inactive and a secondary voltage VARY2, which is approximately a half or a smaller positive voltage of the array voltage VARY, may not be provided to the first node 501 of the mode transistor 55. When the third wipe-out control signal WOX3 is at the logic high level and active at the state (2) of the hysteresis curve 2, the third transistor 53 may be activated. Responsive to the activated third transistor 53, the secondary voltage VARY2 may be provided to the first node 501 of the mode transistor 55 until the state (3) of the hysteresis curve 2. The fourth transistor 54 may be an n-type field effect transistor that has a transistor gate that may receive a fourth wipe-out control signal WOX4 that is an active high signal. When the fourth wipe-out control signal WOX4 is at the logic low level and inactive, the fourth transistor 54 is inactive and substantially zero voltage may not be provided to the first node 501 of the mode transistor 55. When the fourth wipe-out control signal WOX4 is at the logic high level and active at the state (3) of the hysteresis curve 2, the fourth transistor 54 may be activated. Responsive to the activated fourth transistor 54, substantially zero voltage may be provided to the first node 501 of the mode transistor 55 until the state (4) of the hysteresis curve 2.

Figure 6:
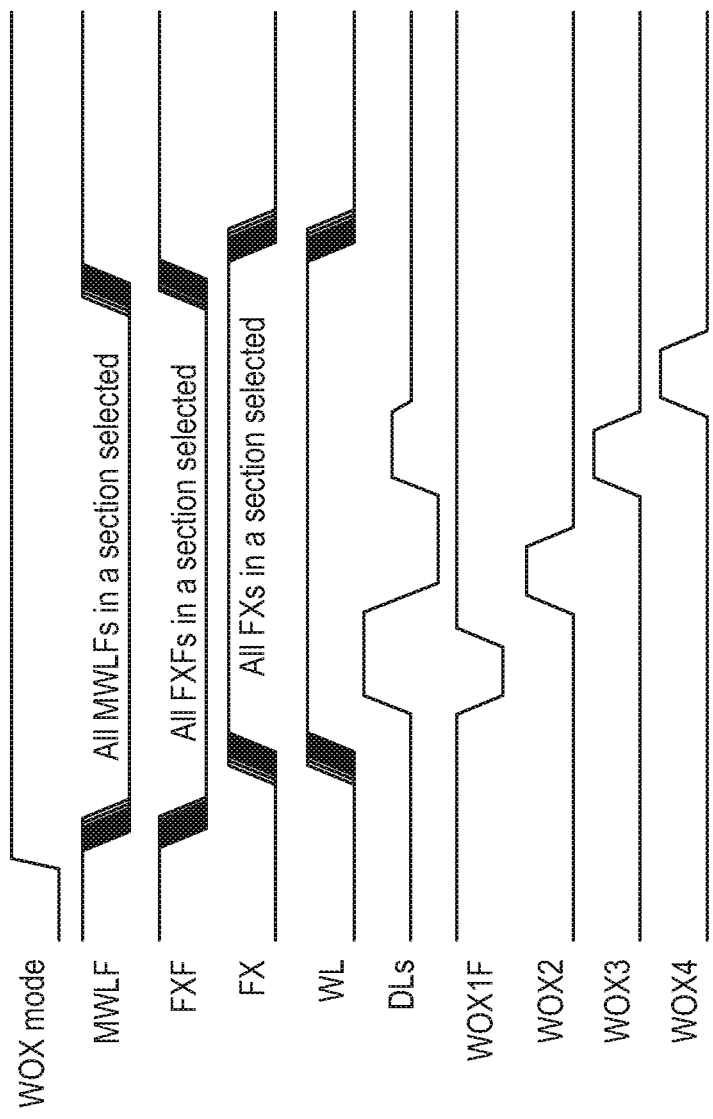
FIG. 6 is a timing diagram of signals in the memory apparatus including the memory cell array for one row cycle in accordance with an embodiment of the present disclosure.

FIG. 6 is a timing diagram of signals in the memory apparatus 3 including the memory cell array 40 for one row cycle in accordance with an embodiment of the present disclosure. Responsive to an activation of the WOX mode signal, the X decoder 31 may provide active inverted main word line (MWLF) select signals and active inverted word driver (FXF) select signals of a selected section based on the selection select signals indicating a section to be selected. For example, the inverted main word line (MWLF) select signals and the inverted word driver (FXF) select signals are active low signals, and the inverted main word line (MWLF) select signals and the inverted word driver (FXF) select signals of the selected section are set to the logic low level. Simultaneously, word driver (FX) select signals of the selected section, having active high signals, are set to the logic high level to be activated. Responsive to the active word driver (FX) select signals of the selected section, word lines (WL) may be activated. Responsive to the first wipe-out control signal WOX1F at the logic low level, digit lines (DLs) may be set to a high positive voltage (e.g., the array voltage VARY). Responsive to the second wipe-out control signal WOX2 at the logic high level, the digit lines (DLs) may be set to a mid-negative voltage (e.g., the negative voltage VKK). Responsive to the third wipe-out control signal WOX3 at the logic high level, the digit lines (DLs) may be set to a low positive voltage (e.g., the half of the array voltage ½ VARY or lower). Responsive to the fourth wipe-out control signal WOX4 at the logic high level, the digit lines (DLs) may be set to substantially zero voltage. After the digit lines (DLs) are set to zero voltage and the ferroelectric memory cells are set in the non-polarized state, the section may be deselected and the inverted main word line (MWLF) select signals and inverted word driver (FXF) select signals are deactivated and the word lines (WLs) in the deselected section may be deactivated.

Figure 7:
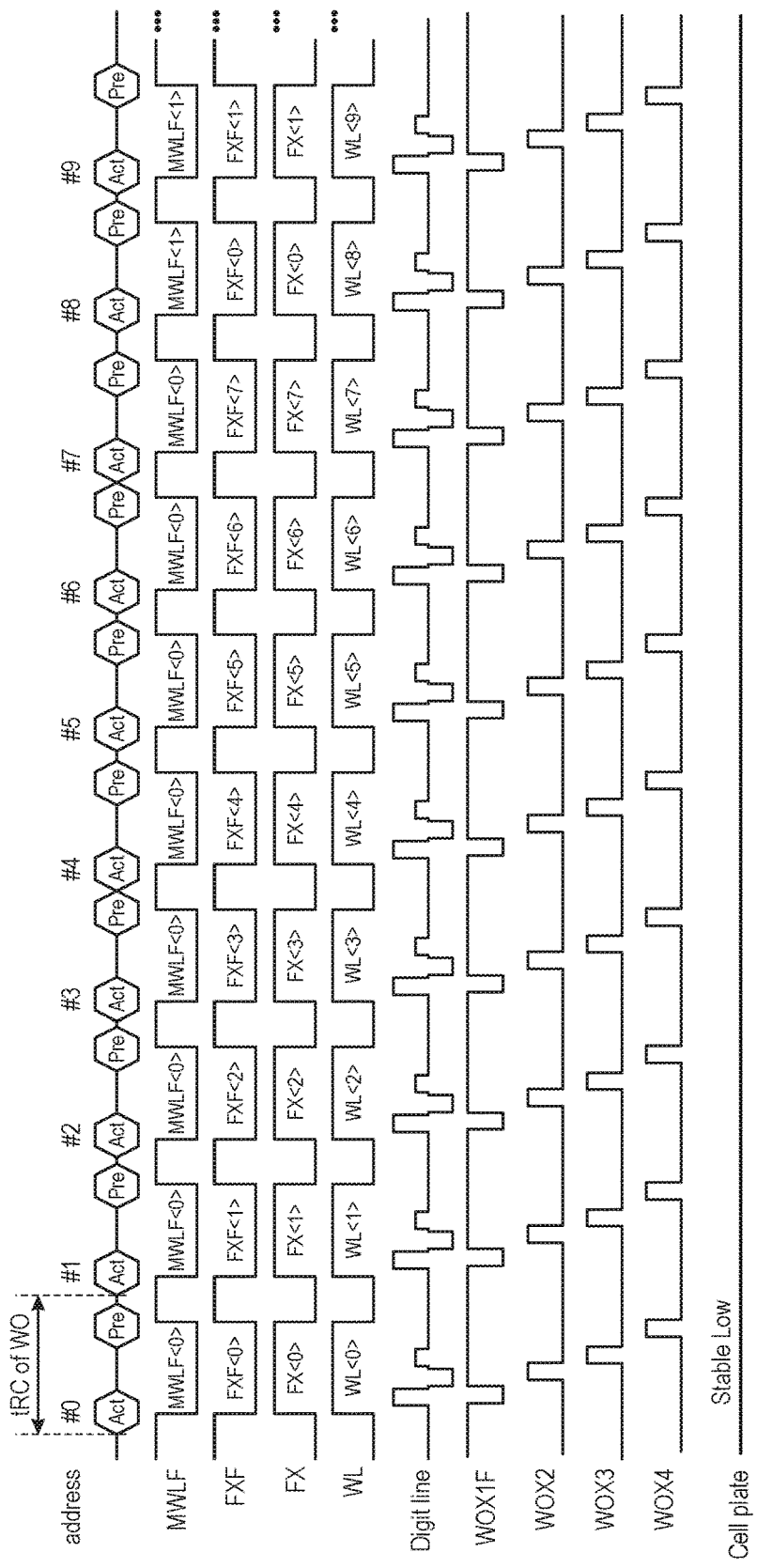
FIG. 7 is a timing diagram of signals in the memory apparatus including the memory cell array for a plurality of row cycles in accordance with an embodiment of the present disclosure.

FIG. 7 is a timing diagram of signals in the memory apparatus 3 including the memory cell array 40 for a plurality of row cycles in accordance with an embodiment of the present disclosure. For example, the timing diagram illustrates nine row address strobe (RAS) cycles (10 tRCs) of the wipe-out operation. For each address of a plurality of addresses #0 to #9, one RAS cycle (1 tRC) of the wipe-out operation may be initiated by executing an active (ACT) command indicative of each corresponding address and may be completed by executing a precharge (PRE) command indicative of each corresponding address. During execution of the wipe-out operation on ferroelectric memory cells having the addresses #0-#7 sharing the same main word line (MWLF<0>), the inverted main word line (MWLF<0>) select signal may be set to a logic low level responsive to the ACT command until execution of the PRE command. Inverted word driver select signals FXF<0> to FXF<7> may be set to a logic low level responsive to the ACT command until execution of the PRE command to a corresponding address #0 to #7. Thus, responsive to the active word driver select signals of the selected section, FX<0> to FX<7>, word lines WL<0> to WL<7> may be activated. Responsive to the ACT command for each address, the wipe-out control signals WOX1F, WOX2, WOX3 and WOX4 may be activated in the order to control the digit line to the high positive voltage (e.g., the array voltage VARY) responsive to the WOX1F signal, to the mid negative voltage (e.g., the negative voltage VKK) responsive to the WOX2 signal, to the low positive voltage (e.g., the half of the array voltage ½ VARY or lower) responsive to the WOX3 signal, and to zero voltage responsive to the WOX4 signal. A voltage of the cell plate (CP) node may be set constant (e.g., zero voltage). Once the wipe-out operation is completed to the corresponding address, the PRE command may be executed. This sequence of controlling the digit line is executed repeatedly in the wipe-out operation. Once the wipe-out operation is complete for the address #0-#7, the wipe-out operation is executed to ferroelectric memory cells having the addresses #8, #9, . . . etc. by setting the inverted main word line (MWLF<1>) to a logic low level responsive to the ACT command together with the FXF signal, the FX signal and thus the word line signals corresponding to the addresses, until execution of the PRE command.

Figure 8A:
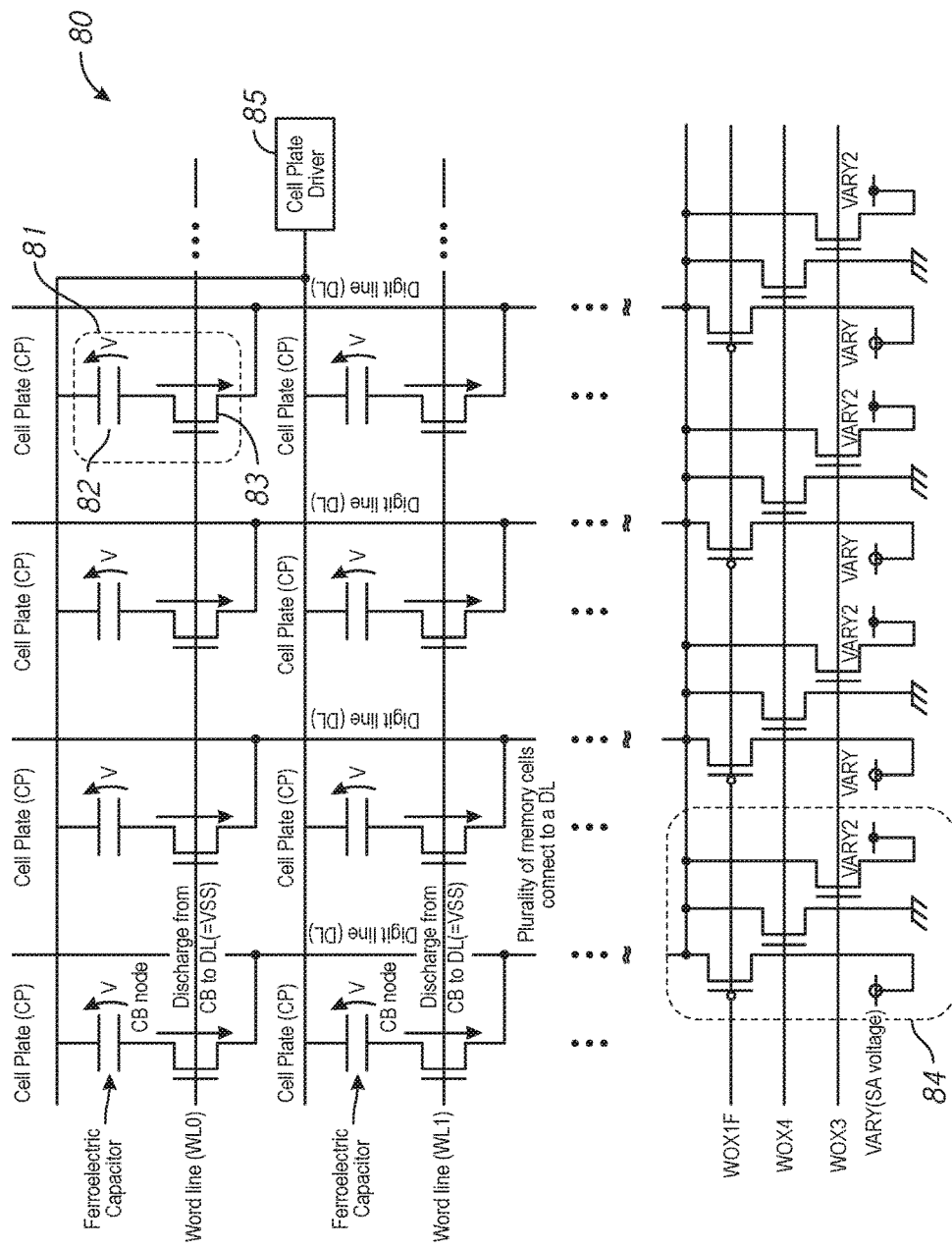
FIG. 8A is a schematic diagram of a plurality of ferroelectric memory cells and a plurality of driver circuits in a memory cell array in a memory apparatus in accordance with an embodiment of the present disclosure.

FIG. 8A is a schematic diagram of a plurality of ferroelectric memory cells 81 and a plurality of driver circuits 84 in a memory cell array in a memory apparatus 80 in accordance with an embodiment of the present disclosure. For example the memory cell array 80 may be the memory cell array 32 in FIGS. 3A and 3B. Each ferroelectric memory cell of the plurality of ferroelectric memory cells 81 may be a ferroelectric memory cell 1 in FIG. 1. Each ferroelectric memory cell 81 may include a ferroelectric capacitor 82 and a selection circuit 83 (e.g., an n-type field effect transistor). Each driver circuit 84 of the plurality of the driver circuits may be configured to provide a plurality of wipe-out control signals WOX1F, WOX3, and WOX4 to control a voltage of a digit line (DL) that is coupled to a plurality of ferroelectric memory cells 81. The voltage of the digit line (DL) that is controlled by the plurality of wipe-out control signals WOX1F, WOX3, and WOX4 may be provided to the CB node of the ferroelectric capacitor 82 by the selection circuit 83 activated by word lines WL0, WL1, . . . etc. When the voltage of the digit line (DL) is substantially zero voltage, an electrical charge of the ferroelectric capacitor 82 may be discharged from the CB node to the digit line (DL) and thus a voltage difference V between the CP and CB nodes of the ferroelectric capacitor 82 may be increased. The memory cell array 80 may also include a cell plate driver 85. The cell plate driver 85 may provide either a normal CP voltage VPLT in a normal mode when the wipe-out operation is not executed or a wipe-out voltage VPLT_WOX that is lower than the normal CP voltage VPLT in a WOX mode during the wipe-out operation responsive to CP control signal in an active state (e.g., a logic high level). The cell plate driver 85 may provide substantially zero voltage responsive to CP control signal in an inactive state (e.g., a logic low level) regardless of a current mode, whether it is the normal mode or the WOX mode.

Figure 8B:
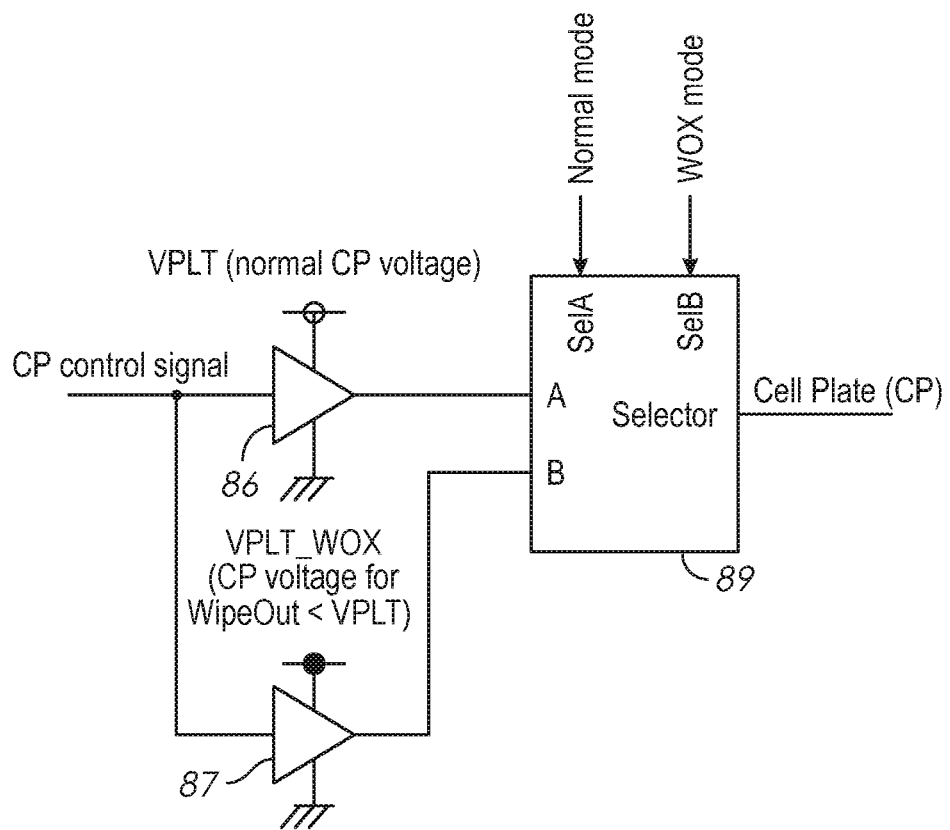
FIG. 8B is a schematic diagram of a cell plate driver in the memory cell array in accordance with an embodiment of the present disclosure.

FIG. 8B is a schematic diagram of the cell plate driver 85 in the memory cell array 80 in accordance with an embodiment of the present disclosure. The cell plate driver 85 may be coupled to cell plate (CP) nodes of the plurality of ferroelectric memory cells 81 to provide a CP voltage. For example, the cell plate driver 85 may receive a CP control signal at multi-state buffers 86 and 87. When the wipe-out operation is not executed, a normal mode is selected and an active signal is provided to SelA node of a selector 89. The selector 89 may provide a signal on an input node A to an output node coupled to the cell plate nodes of the ferroelectric capacitors 82, responsive to the active signal at the SelA node. The multi-state buffer 86 may receive the CP control signal, a normal CP voltage VPLT and substantially zero voltage and provide a signal on an output node that is coupled to the input node A of the selector 89, responsive to the CP control signal. If the CP control signal is active (e.g., at the logic high level), the multi-state buffer 86 may provide the normal CP voltage VPLT to the input node B of the selector 89. If the CP control signal is inactive (e.g., at the logic low level), the multi-state buffer 86 may provide substantially zero voltage to the input node A of the selector 89. Thus, in the normal mode, the selector 89 may provide either the normal CP voltage VPLT responsive to the CP control signal in the active state or substantially zero voltage responsive to the CP control signal in the inactive state to the cell plate nodes of the ferroelectric capacitors 82.

When the wipe-out operation is being executed, a WOX mode may be selected and an active signal is provided to SelB node of the selector 89. The selector 89 may provide a signal on an input node B to the output node coupled to the cell plate nodes of the ferroelectric capacitors 82, responsive to the active signal at the SelB node. For example, the multi-state buffer 87 may receive the CP control signal, a CP voltage for the wipe-out operation VPLT_WOX and substantially zero voltage. If the CP control signal is active (e.g., at the logic high level), the multi-state buffer 87 may provide the CP voltage for the wipe-out operation VPLT_WOX to the input node B of the selector 89. If the CP control signal is inactive (e.g., at the logic low level), the multi-state buffer 87 may provide substantially zero voltage to the input node B of the selector 89. Thus, in the WOX mode, the selector 89 may provide either the CP voltage for the wipe-out operation VPLT_WOX responsive to the CP control signal in the active state or substantially zero voltage responsive to the CP control signal in the inactive state to the cell plate nodes of the ferroelectric capacitors 82.

Figures 9A, 9B:
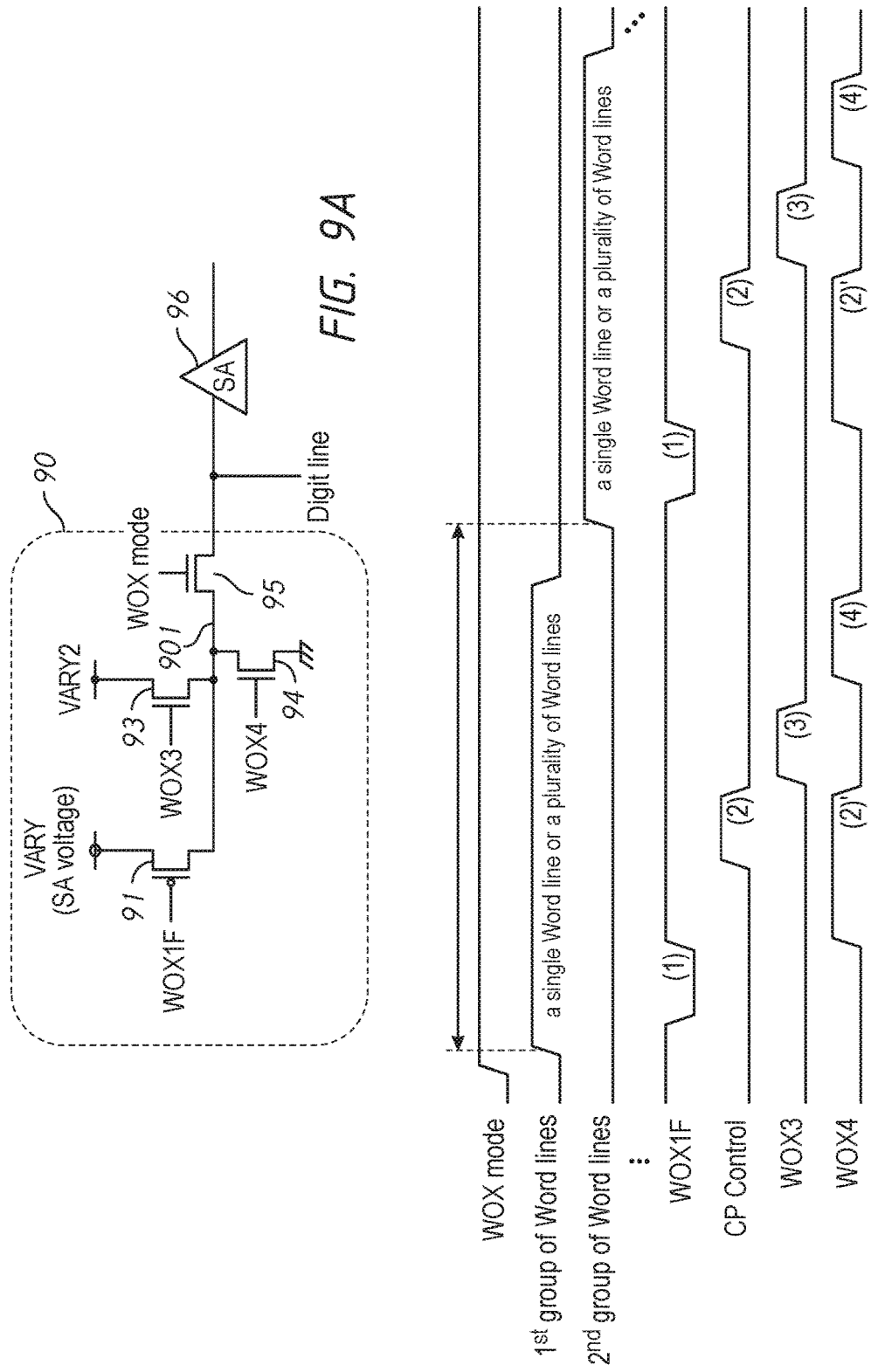
FIG. 9A is a schematic diagram of a driver circuit coupled to a sense amplifier in the memory cell array in accordance with an embodiment of the present disclosure.
FIG. 9B is a timing diagram of the driver circuit in accordance with an embodiment of the present disclosure.

FIG. 9A is a schematic diagram of a driver circuit 90 coupled to a sense amplifier 96 in accordance with an embodiment of the present disclosure. The driver circuit 90 may be used as each of the plurality of driver circuits 84 in the memory cell array 80 of FIG. 8A. The driver circuit 90 may include a first transistor 91, a second transistor 93 and a third transistor 94 that have drain nodes that may be coupled to a first node 901 of a mode transistor 95. The mode transistor 95 has a second node that may be coupled to a digit line (DL) and a sense amplifier (SA) 96.

FIG. 9B is a timing diagram of the driver circuit 90 in accordance with an embodiment of the present disclosure. During the wipe-out operation, a wipe-out mode signal WOX mode may be in an active state (e.g., a logic high level). The mode transistor 95 may be an n-type field effect transistor that has a transistor gate that may receive the wipe-out mode signal WOX mode that is an active high signal. When the wipe-out mode signal WOX mode is at a logic high level and active, the mode transistor 95 may be activated and couple the first node 901 of the mode transistor 95 to the digit line (DL) and to the sense amplifier (SA) 96. Thus, responsive to the activated mode transistor 95, a voltage on the first node 901 of the mode transistor 95 may be provided to the digit line (DL) that is further coupled to the sense amplifier (SA) 96. When the wipe-out mode signal WOX mode is at a logic low level and inactive, the mode transistor 95 is inactive and the voltage on the first node 901 may not be provided to the digit line (DL).

Each word line or each plurality of word lines may be activated for the RAS cycle (tRC) of the wipe-out operation, from a first group of word line(s), a second group of word line(s), . . . etc. The wipe-out control signals WOX1F, WOX4, the CP control signal, and the wipe-out control signal WOX3 may be activated in this order for each RAS cycle to operate the wipe-out operation following paths →(1)→(2)→(3)→(4) as illustrated in the hysteresis curve 2 in FIG. 2. For example, the first transistor 91 may be a p-type field effect transistor that has a transistor gate that may receive a first wipe-out control signal WOX1F that is an active low signal. When the first wipe-out control signal WOX1F is at the logic high level and inactive, the first transistor 91 is inactive and the first node 901 of the mode transistor 95 is decoupled from an array voltage (VARY) being a positive voltage, an SA voltage for the sense amplifier (SA) 96. When the first wipe-out control signal WOX1F is at the logic low level and active, the first transistor 91 is activated and the array voltage (VARY), the SA voltage for the sense amplifier (SA) 96, may be provided to the first node 901 of the mode transistor 95 until the state (1) of the hysteresis curve 2.

The third transistor 94 may be an n-type field effect transistor that has a transistor gate that may receive a third wipe-out control signal WOX4 that is an active high signal. When the third wipe-out control signal WOX4 is at the logic low level and inactive, the third transistor 94 is inactive and substantially zero voltage may not be provided to the first node 901 of the mode transistor 95. When the third wipe-out control signal WOX4 is at the logic high level and active at the state (1) of the hysteresis curve 2, the third transistor 94 may be activated and substantially zero voltage may be provided to the first node 901 of the mode transistor 95 until state (2)' that is a pre-state of the state (2) of the hysteresis curve 2. As discussed earlier, the CP control signal may be activated following the activation of the third wipe-out control signal WOX4 to provide the CP voltage for the wipe-out operation VPLT_WOX to the CP nodes of ferroelectric capacitors (e.g., the ferroelectric capacitors 82) until an end of the state (2) of the hysteresis curve 2.

The second transistor 93 may be an n-type field effect transistor that has a transistor gate that may receive a second wipe-out control signal WOX3 that is an active high signal. When the second wipe-out control signal WOX3 is at the logic low level and inactive, the second transistor 93 is inactive and a secondary voltage VARY2, which is approximately a half or a smaller positive voltage of the array voltage VARY, may not be provided to the first node 901 of the mode transistor 95. When the second wipe-out control signal WOX3 is at the logic high level and active at the state (3) of the hysteresis curve 2, the second transistor 93 may be activated. Responsive to the activated second transistor 93, the secondary voltage VARY2 may be provided to the first node 901 of the mode transistor 95 until an end of the state (3) of the hysteresis curve 2. The third transistor 94 may be activated again after reaching the state (3). When the third wipe-out control signal WOX4 is at the logic high level and active at the state (4) of the hysteresis curve 2, the third transistor 94 may be activated. Responsive to the activated third transistor 94, substantially zero voltage may be provided to the first node 901 of the mode transistor 95 until the state (4) of the hysteresis curve 2.

Figure 10:
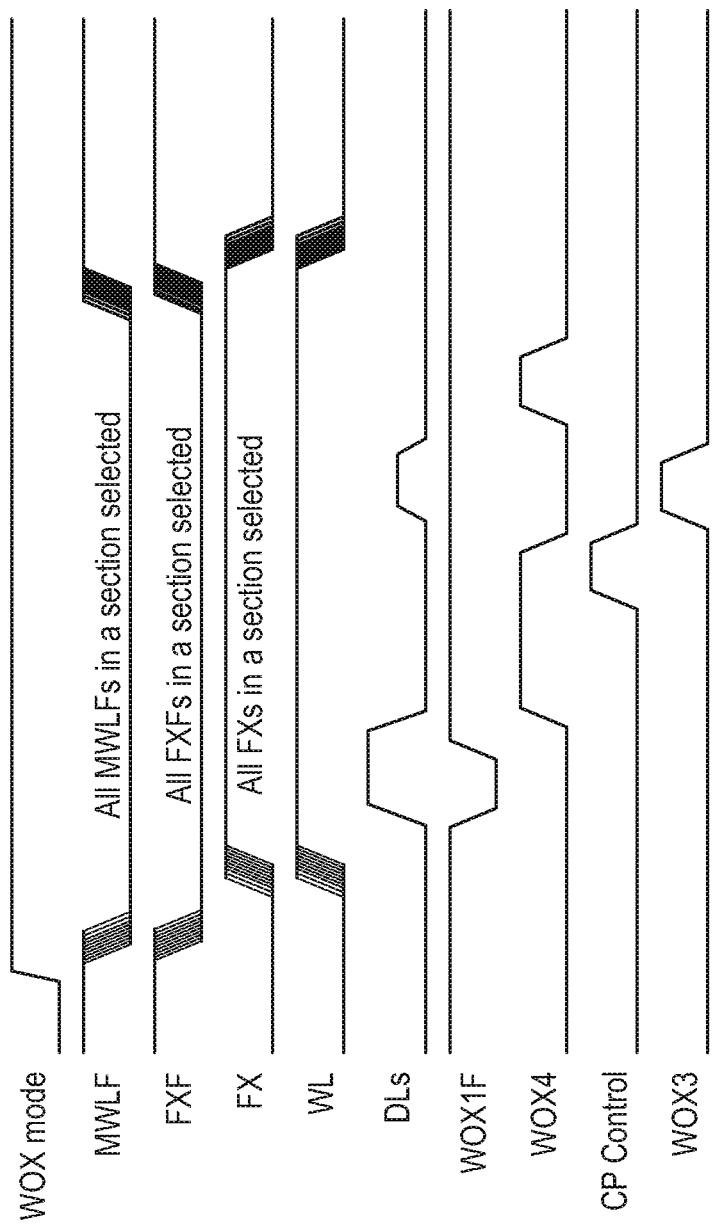
FIG. 10 is a timing diagram of signals in the memory apparatus including the memory cell array for one row cycle in accordance with an embodiment of the present disclosure.

FIG. 10 is a timing diagram of signals in the memory apparatus 3 including the memory cell array 80 for one row cycle in accordance with an embodiment of the present disclosure. Responsive to an activation of the WOX mode signal, the X decoder 31 may provide active inverted main word line (MWLF) select signals and active inverted word driver (FXF) select signals of a selected section based on the selection select signals indicating a section to be selected. For example, the inverted main word line (MWLF) select signals and the inverted word driver (FXF) select signals are active low signals, and the inverted main word line (MWLF) select signals and the inverted word driver (FXF) select signals of the selected section are set to the logic low level. Simultaneously, word driver (FX) select signals of the selected section, having active high signals, are set to the logic high level to be activated. Responsive to the active word driver (FX) select signals of the selected section, word lines (WL) may be activated. Responsive to the first wipe-out control signal WOX1F at the logic low level, digit lines (DLs) may be set to a high positive voltage (e.g., the array voltage VARY). Responsive to the third wipe-out control signal WOX4 at the logic high level for the first time following the activation of the first wipe-out control signal WOX1F, the digit lines (DLs) may be set to substantially zero voltage for the first time. The CP control signal is activated following the activation of the third wipe-out control signal WOX4, to set the CP nodes of the ferroelectric capacitors to the CP voltage for the wipe-out operation VPLT_WOX. Responsive to the second wipe-out control signal WOX3 at the logic high level, the digit lines (DLs) may be set to a low positive voltage (e.g., the half of the array voltage ½ VARY or lower). Responsive to the third wipe-out control signal WOX4 at the logic high level for the second time, the digit lines (DLs) may be set to substantially zero voltage for the second time. After the digit lines (DLs) are set to zero voltage by the second activation of the third wipe-out control signal WOX4 and the ferroelectric memory cells are set in the non-polarized state, the section may be deselected and the inverted main word line (MWLF) select signals and inverted word driver (FXF) select signals are deactivated and the word lines (WLs) in the deselected section may be deactivated.

Figure 11:
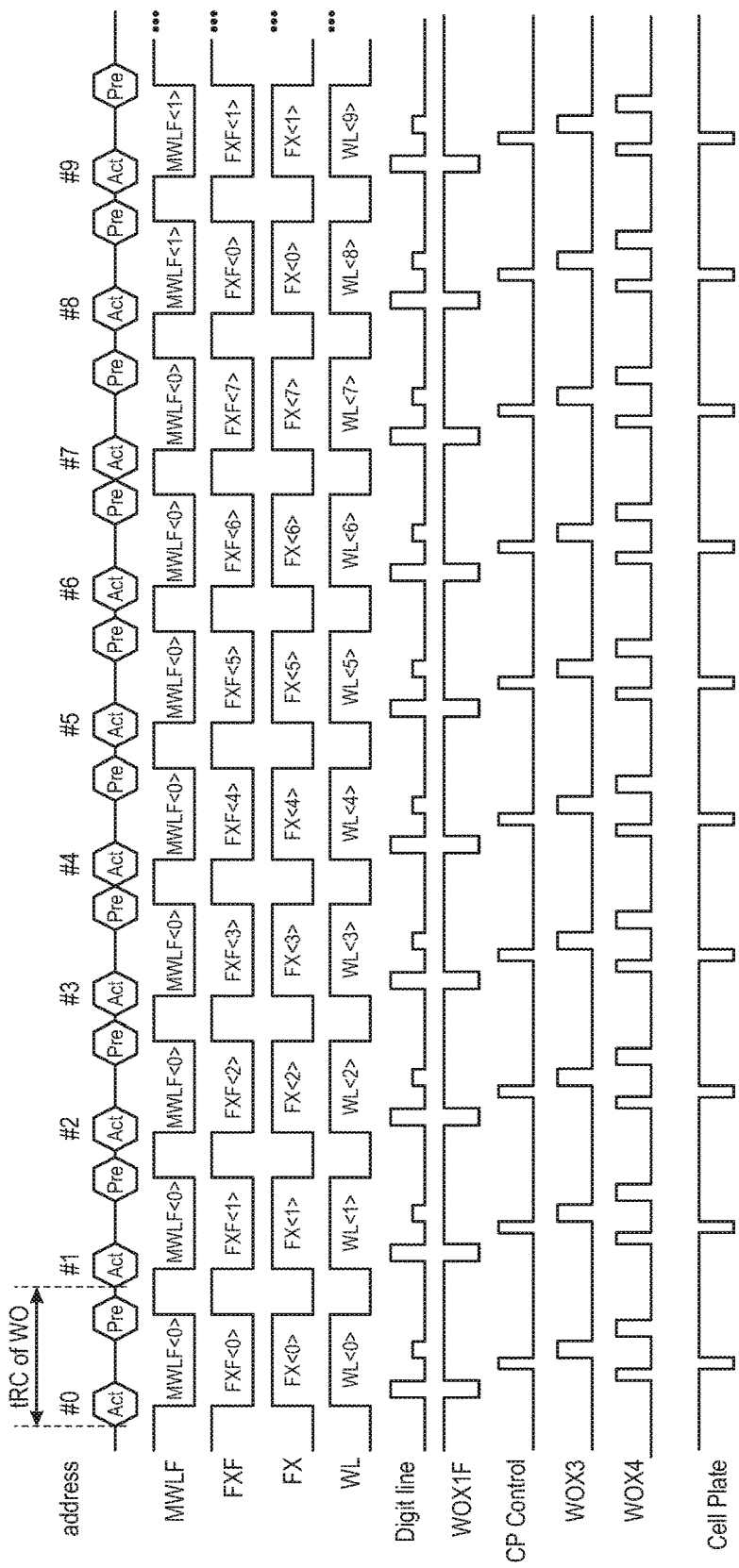
FIG. 11 is a timing diagram of signals in the memory apparatus including the memory cell array for a plurality of row cycles in accordance with an embodiment of the present disclosure.

FIG. 11 is a timing diagram of signals in the memory apparatus 3 including the memory cell array 80 for a plurality of row cycles in accordance with an embodiment of the present disclosure. For example, the timing diagram illustrates nine row address strobe (RAS) cycles (10 tRCs) of the wipe-out operation. For each address of a plurality of addresses #0 to #9, one RAS cycle (1 tRC) of the wipe-out operation may be initiated by executing an active (ACT) command indicative of each corresponding address and may be completed by executing a precharge (PRE) command indicative of each corresponding address. During execution of the wipe-out operation on ferroelectric memory cells having the addresses #0-#7 sharing the same main word line (MWLF<0>), the inverted main word line (MWLF<0>) select signal may be set to a logic low level responsive to the ACT command until execution of the PRE command. Inverted word driver select signals FXF<0> to FXF<7> may be set to a logic low level responsive to the ACT command until execution of the PRE command to a corresponding address #0 to #7. Thus, responsive to the active word driver select signals of the selected section, FX<0> to FX<7>, word lines WL<0> to WL<7> may be activated. Responsive to the ACT command for each address, the wipe-out control signals WOX1F, WOX4, the CP control signal, the wipe-out control signals WOX3 and WOX4 again may be activated in the order to control the digit line to the high positive voltage (e.g., the array voltage VARY) responsive to the WOX1F signal, to the substantially zero voltage responsive to the WOX4 signal followed by the CP voltage for the wipe-out operation VPLT_WOX responsive to the CP control signal, to the low positive voltage (e.g., the half of the array voltage ½ VARY or lower) responsive to the WOX3 signal, and to zero voltage responsive to the WOX4 signal. A voltage of the cell plate (CP) node may be controlled by the CP control signal to set to either the substantially zero voltage or the CP voltage for the wipe-out operation VPLT_WOX. Once the wipe-out operation is completed to the corresponding address, the PRE command may be executed. This sequence of controlling the digit line and the CP node is executed repeatedly in the wipe-out operation. Once the wipe-out operation is complete for the address #0-#7, the wipe-out operation is executed to ferroelectric memory cells having the addresses #8, #9, . . . etc. by setting the inverted main word line (MWLF<1>) to a logic low level responsive to the ACT command together with the FXF signal, the FX signal and thus the word line signals corresponding to the addresses, until execution of the PRE command.

Logic levels of signals, types of transistors, types of data input circuits used in the embodiments described the above are merely examples. However, in other embodiments, combinations of the logic levels of signals, types of transistors, types of data input circuits other than those specifically described in the present disclosure may be used without departing from the scope of the present disclosure.

Although this invention has been disclosed in the context of certain preferred embodiments and examples, it will be understood by those skilled in the art that the inventions extend beyond the specifically disclosed embodiments to other alternative embodiments and/or uses of the inventions and obvious modifications and equivalents thereof. In addition, other modifications which are within the scope of this invention will be readily apparent to those of skill in the art based on this disclosure. It is also contemplated that various combination or sub-combination of the specific features and aspects of the embodiments may be made and still fall within the scope of the inventions. It should be understood that various features and aspects of the disclosed embodiments can be combined with or substituted for one another in order to form varying mode of the disclosed invention. Thus, it is intended that the scope of at least some of the present invention herein disclosed should not be limited by the particular disclosed embodiments described above.

What is claimed is:

1. An apparatus comprising:
    a memory cell array comprising:
        a first plurality of first address lines;
        a second address line; and
        a plurality of ferroelectric memory cells, wherein each ferroelectric memory cell includes:
            a ferroelectric capacitor configured to store data, the ferroelectric capacitor having a first terminal and further having a second terminal coupled to a cell plate node configured to receive a cell plate voltage; and
            a selection circuit having a first node coupled to a corresponding first address line of the first plurality of first address lines, a second node coupled to the second address line and the third node coupled to the first terminal of the ferroelectric capacitor, the selection circuit configured to couple the second node to the third node responsive to a logic level of the corresponding first address line;

a control circuit configured to provide a section select signal and a first address select signal responsive to an address; and an address decoder configured to activate a second plurality of first address lines among the first plurality of first address lines, wherein the control circuit is further configured to control a second address line voltage of the second address line in order to set the ferroelectric capacitor to a non-polarized state.

2. The apparatus of claim 1, wherein the control circuit further comprises a first address pre-decoder configured to provide the section select signal and the first address select signal to the address decoder responsive to a first address, and wherein the address decoder is configured to activate one or more first address lines responsive to the section select signal and the first address select signal.

3. The apparatus of claim 2, wherein the control circuit further comprises an address counter configured to increase or decrease the address, and further configured to provide the address as the first address to the first address pre-decoder.

4. The apparatus of claim 3, wherein the control circuit is configured to provide the section select signal and the first address select signal to the address decoder to select the second plurality of first address lines sequentially.

5. The apparatus of claim 1, wherein the control circuit is configured to provide the section select signal and the first address select signal to the address decoder to select the second plurality of first address lines simultaneously.

6. The apparatus of claim 1, wherein the control circuit comprises a row control circuit configured to provide a plurality of control signals to control the second address line voltage of the second address line, the plurality of control signals including:

a first control signal configured to set the second address line voltage to a first voltage of a first polarity;

a second control signal configured to set the second address line voltage to a second voltage of the first polarity having a smaller amplitude than the first voltage; and a third control signal configured to set the second address line voltage to a third voltage that is substantially zero voltage.

7. The apparatus of claim 6, wherein the memory cell array further includes a driver circuit configured to receive the first, second and third control signals, and wherein the driver circuit is configured to provide the first, second and third voltages to the second address line responsive to the first, second and third control signals, respectively.

8. The apparatus of claim 7, wherein the plurality of control signals further includes a fourth control signal configured to set the second address line voltage to a fourth voltage of a second polarity different from the first polarity.

9. The apparatus of claim 8, wherein the driver circuit is further configured to provide the fourth voltage to the second address line responsive to the fourth control signal.

10. The apparatus of claim 8, wherein the row control circuit is configured to activate the plurality of control signals in an order of the first control signal, the fourth control signal, the second control signal and the third control signal.

11. The apparatus of claim 1, wherein the memory cell array further includes a cell plate driver configured to provide the cell plate voltage responsive to a cell plate control signal, wherein the cell plate driver is configured to provide either a normal cell plate voltage in a normal mode or a wipe-out cell plate voltage lower than the normal cell plate voltage in a wipe-out mode responsive to the cell plate control signal in an active state, and further configured to provide substantially zero voltage responsive to the cell plate control signal in an inactive state.

12. The apparatus of claim 11, wherein the row control circuit is configured to activate the plurality of control signals in a manner that the plurality of control signals and the cell plate control signal are activated in an order of the first control signal, the third control signal followed by the cell plate control signal, the second control signal and the third control signal.

13. A method comprising:

providing a section select signal and a first address select signal of a first address responsive to an address, in order to select a first plurality of first address lines among a second plurality of first address lines coupled to the memory cell array by a control circuit;

activating the first plurality of first address lines responsive to the section select signal and the first address select signal by an address decoder;

coupling a second address line to cell bottom nodes of a plurality of memory cells by a plurality of transistors of the plurality of memory cells responsive to logic levels of the first plurality of first address lines coupled to the plurality of transistors; and controlling a second address line voltage of the second address line to set a plurality of ferroelectric capacitors of the plurality of memory cells to a non-polarized state by the control circuit to erase data on a plurality of memory cells.

14. The method of claim 13, further comprising:
receiving the address by an address counter; and
increasing the address by the address counter.

15. The method of claim 13, further comprising:
receiving the address by an address counter; and
decreasing the address by the address counter.

16. The method of claim 13, wherein the first plurality of first address lines are activated sequentially by the address decoder responsive to the first address.

17. The method of claim 13, wherein the first plurality of first address lines are activated simultaneously by the address decoder responsive to the first address.

18. The method of claim 13, wherein controlling the second address line voltage of the second address line comprises:

activating a transistor of the memory cell to couple a second address line to a cell bottom node of a ferroelectric capacitor;

providing a first control signal in an active state by a control circuit responsive to the first address;

applying a first voltage of a first polarity to the second address responsive to the first control signal;

providing a second control signal in the active state by the control circuit after applying the first voltage;

applying a second voltage of a first polarity to the digit line responsive to the first control signal;

providing a third control signal in the active state by the control circuit after applying the second voltage; and applying substantially zero voltage to the digit line responsive to the third control signal.

19. The method of claim 18, further comprising:
providing a fourth control signal in an active state by the control circuit after applying the first voltage before applying the second control signal in the active state; and
applying a third voltage of a second polarity different from the first polarity to the digit line responsive to the fourth control signal.

20. The method of claim 18, further comprising:
providing the third control signal in the active state by the control circuit after applying the first voltage and before applying the second control signal in the active state;
applying substantially zero voltage to the digit line responsive to the third control signal;
providing a cell plate control signal in an active state to a cell plate driver circuit after providing the third control signal before providing the second control signal; and
applying a cell plate voltage having a negative polarity by the cell plate driver circuit to cell plates of the ferroelectric capacitor.

21. An apparatus comprising:
a memory cell array comprising:
   a first plurality of word lines;
   a digit line; and
   a plurality of ferroelectric memory cells, wherein each ferroelectric memory cell includes:
      a ferroelectric capacitor configured to store data, the ferroelectric capacitor having a cell bottom node and further having a cell plate node configured to receive a cell plate voltage; and
      a memory cell transistor having a transistor gate coupled to a corresponding word line of the first plurality of word lines, the memory cell transistor configured to couple the cell bottom node of the ferroelectric capacitor to the digit line responsive to a logic level of the corresponding word line;
a control circuit configured to provide a section select signal, a word line select signal, and a word driver select signal responsive to an address; and
an address decoder configured to activate a second plurality of word lines among the first plurality of word lines,
wherein the control circuit is further configured to control a digit line voltage of the digit line in order to set the ferroelectric capacitor to a non-polarized state.

22. The apparatus of claim 21, wherein the memory cell transistor comprises an n-type field effect transistor.

23. The apparatus of claim 21, wherein the control circuit comprises a row control circuit configured to provide a plurality of control signals to control the digit line voltage of the digit line, the plurality of control signals including:
a first control signal configured to set the digit line voltage to a first voltage of a first polarity;
a second control signal configured to set the digit line voltage to a second voltage of the first polarity having a smaller amplitude than the first voltage; and
a third control signal configured to set the digit line voltage to a third voltage that is substantially zero voltage.

24. The apparatus of claim 23, wherein the memory cell array further comprises a plurality of driver circuits, wherein each driver circuit of the plurality of driver circuits includes:
a mode transistor having a first node, a second node coupled to the digit line and a gate configured to receive a mode signal, the mode transistor configured to couple the first node to the second node responsive to the mode signal;
a first transistor having a gate configured to receive the first control signal, the first transistor configured to couple the first node of the mode transistor to the first voltage of the first polarity;
a second transistor having a gate configured to receive the second control signal, the second transistor configured to couple the first node of the mode transistor to the second voltage of the first polarity; and
a third transistor having a gate configured to receive the third control signal, the third transistor configured to couple the first node of the mode transistor to the third voltage.

25. The apparatus of claim 24, wherein the first transistor comprises a p-type field effect transistor and the second transistor and the third transistor comprise n-type field effect transistors.

26. The apparatus of claim 24, wherein the plurality of control signals further includes a fourth control signal configured to set the second address line voltage to a fourth voltage of a second polarity different from the first polarity.

27. The apparatus of claim 26, wherein the driver circuit is further configured to provide the fourth voltage to the digit line responsive to the fourth control signal.

28. The apparatus of claim 26, wherein the row control circuit is configured to activate the plurality of control signals in an order of the first control signal, the fourth control signal, the second control signal and the third control signal.

29. The apparatus of claim 24, wherein the memory cell array further comprises a cell plate driver configured to provide either a normal cell plate voltage in a normal mode or a wipe-out cell plate voltage lower than the normal cell plate voltage in a wipe-out mode to the cell plate node responsive to the cell plate control signal in an active state, and further configured to provide substantially zero voltage to the cell plate node responsive to the cell plate control signal in an inactive state.

30. The apparatus of claim 29, wherein the cell plate driver comprises:
a selector comprising a first input node, a second input node and at least one mode node configured to receive a mode signal;
a first multi-state buffer configured to receive a cell plate control signal and configured to provide either the normal cell plate voltage or substantially zero voltage to the first input node responsive to the cell plate control signal,
a second multi-state buffer configured to provide the wipe-out cell plate voltage responsive to the cell plate control signal in an active state, and further configured to provide substantially zero voltage to the second input node responsive to the cell plate control signal in an inactive state,
wherein the selector is configured to provide either a first signal on the first input node or a second signal on the second input node responsive to the mode signal indicative of the normal mode or the wipe-out mode, respectively.

31. The apparatus of claim 29, wherein the row control circuit is configured to activate the plurality of control signals in a manner that the plurality of control signals and the cell plate control signal are activated in an order of the first control signal, the third control signal followed by the cell plate control signal, the second control signal and the third control signal.

\* \* \* \* \*